(12) United States Patent
Fujishima et al.

(10) Patent No.: US 6,607,673 B2
(45) Date of Patent: Aug. 19, 2003

(54) METHOD FOR MANUFACTURING A DIAMOND CYLINDER ARRAY HAVING DENTS THEREIN

(75) Inventors: Akira Fujishima, Kawasaki (JP); Hideki Masuda, Hachioji (JP)

(73) Assignee: The University of Tokyo, Tokyo (JP)

( * ) Notice: Subject to any disclaimer, the term of this patent is extended or adjusted under 35 U.S.C. 154(b) by 0 days.

(21) Appl. No.: 09/932,833

(22) Filed: Aug. 17, 2001

(65) Prior Publication Data

US 2002/0096107 A1 Jul. 25, 2002

Related U.S. Application Data

(63) Continuation-in-part of application No. 09/854,862, filed on May 14, 2001.

(30) Foreign Application Priority Data

May 17, 2000 (JP) ........................................ 2000-144899

(51) Int. Cl.⁷ ................................................. B81B 7/04
(52) U.S. Cl. ............................. 216/11; 216/67; 216/81
(58) Field of Search ............................... 216/11, 12, 13, 216/67, 81

(56) References Cited

U.S. PATENT DOCUMENTS

| 4,957,591 A | 9/1990 | Sato et al. ................... 156/643 |
| 5,844,252 A | * 12/1998 | Shiomi et al. ................. 257/10 |
| 6,312,612 B1 | * 11/2001 | Sherman et al. .............. 216/11 |

FOREIGN PATENT DOCUMENTS

| EP | 0 923 104 A | 6/1999 |
| JP | 10-312735 | 11/1998 |
| JP | 2000-1392 | 1/2000 |
| WO | WO 0 923 44529 | 10/1998 |

OTHER PUBLICATIONS

Goeting C H et al: "Electrochemically induced surface modifications of boron–doped diamond electrodes: an X–ray photoelectron spectroscopy study", Diamond and Related Materials, NL, Elsevier Science Publishers, Amsterdam, vol. 9, No. 3–6, Apr. 2000 (2000–04), pp. 390–396.

* cited by examiner

Primary Examiner—Shrive P. Beck
Assistant Examiner—Allan Olsen
(74) Attorney, Agent, or Firm—Knobbe Martens Olson & Bear, LLP

(57) ABSTRACT

A cylinder array of diamond having a dent in its cylinder top face is manufactured by subjecting a cylinder array of diamond to a plasma etching.

7 Claims, 2 Drawing Sheets

METHOD FOR MANUFACTURING A DIAMOND CYLINDER ARRAY HAVING DENTS THEREIN

This application is a continuation-in-part of the U.S. patent application Ser. No. 09/854,862, filed May 14, 2001.

BACKGROUND OF THE INVENTION

1. Field of the Invention

The present invention relates to a method for manufacturing an array of diamond cylinders each having a dent in its end portion.

2. Description of Related Art

A diamond cylinder structural body, especially a diamond cylinder structural body provided with electrical conductivity by doping is used for an electron emission source for a display, a gas sensor, an electrode material, and the like. For this purpose, it is usually important to form a fine and regular structure for improving performances. As an effective method for manufacturing such a cylinder-shaped diamond, there is known a method wherein a structure having a regular construction is previously prepared and vapor deposited diamond is formed thereon by using this structure as a mold and then the mold is dissolved out to form protrusion-like diamond with a uniform shape [K. Okada et al., Applied Physics Letters, vol.64, p.2742 (1994)]. The regular structure used as the mold is provided by working silicon or the like through a usual lithography technique.

For the applications of the cylinder structural body, it is important matters to minimize a diameter of each cylinder and increase a ratio of cylinder length/cylinder diameter or an aspect ratio. For example, the minimization of the diameter of the cylinder becomes an important matter in order to more efficiently concentrate electrical field into an end of a needle-like structure in an electron emission source.

For this purpose, the inventors have proposed a method wherein an anodized porous alumina, which is known to have a regular porous structure, is used as a mold and diamond is grown thereon by a CVD process and thereafter the anodized porous structure is dissolved out to obtain a cylinder-shaped diamond with a high aspect ratio [Masuda et al., The Electrochemical Society of Japan, 1998 Autumn Time Annual Proceedings, 1c18(1998)]. According to this method, it is possible to produce an array of fine cylinders at a low cost and a high throughput. In addition, a mold structure (anodized porous alumina) having a high ratio of pore depth/opening diameter (aspect ratio), which has never been formed in the usual lithography, is obtained, so that an aspect ratio of a cylinder structural body formed is made higher. At the same time, the inventors have disclosed a technique wherein fine diamond particles as a growth nucleus are uniformly applied onto inner walls of pores in the anodized porous alumina to obtain a cylindrical diamond-like carbon having a hollow portion in its top face [Masuda et al., Proceedings of the aforementioned lecture]. In this technique, a cylindrical structure is formed by uniformly distributing fine diamond particles as a growth nucleus on the wall faces of the pores in the anodized porous alumina and at the same time starting the growth of diamond-like carbon from the whole wall face.

When the array of diamond cylinders is formed by using the anodized porous alumina as a mold as mentioned above, the top portion of each of the cylinders formed has a flat shape. When such a cylinder array is used in an electron emitter, there is a problem that the concentration of electrical field is difficult. And also, if it is intended to apply such an array to an electrode or the like, it is difficult to carry other substances (catalytic metal, enzyme, etc.) on the top portion of the cylinder.

On the other hand, the cylinder having a hollow portion formed by uniformly applying the growth nucleuses on the wall face to conduct the CVD process consists of diamond-like carbon having a crystal form different from that of diamond, so that there is a problem in the use for the electron emitter or the electrode.

SUMMARY OF THE INVENTION

It is, therefore, an object of the present invention to provide a method for forming a dent or a hollow portion opening at a top face of a diamond cylinder.

The inventors have found that when a cylinder array of diamond is subjected to a plasma etching from the top face side of the cylinder, a dent opening toward the top side can selectively be formed in each cylinder. In other words, it has been found that only a central portion in the top face of each of the diamond cylinders is selectively etched, but a peripheral edge portion of each cylinder remains as a cylindrical or annular protrusion without being etched. In this case, a mask is not used. Such a selective etching phenomenon is not known up to this day.

Therefore, it is possible to obtain a cylinder-shaped diamond having a hollow structure in which only the central portion is selectively etched by adjusting an etching time and also it is possible to adjust a depth of a dent or a ratio of depth to width in the dent.

The thus obtained cylinder array having dents therein can be expected to have a high efficiency as an electron emitter. And also, it is possible to carry a given substance on the dent in the top portion of the cylinder. Therefore, the present invention can be said to be a basic manufacturing method in the field of diamond electronic parts, which will be expected to develop in the future.

In the present invention, the number and shape of cylinders included in the cylinder array are not critical. However, the width (diameter) of the cylinder is preferable to be 100–300 nm, and the height thereof is preferable to be 1–10 $\mu$m. Furthermore, the ratio of height to diameter in the cylinder (aspect ratio) is preferable to be not less than 3.

Particularly, the cylinder can be formed in accordance with the form of the pore in the anodized porous alumina by using the anodized porous alumina as a mold and forming diamond in each pore of the anodized porous alumina through a vapor phase growing process before plasma etching.

The anodized alumina is a porous oxide film formed by anodizing aluminum in a proper acidic electrolyte, wherein fine straight pores having a high aspect ratio are arranged at approximately equal intervals. The pore diameter, pore interval, and pore length can be controlled by adjusting anodization conditions. The anodized alumina can be rendered into a self-supporting film by selectively dissolving out an aluminum matrix after the anodization. Furthermore, the fine pores can be made to through-holes by dissolving out a bottom portion of the film through an etching treatment.

A cylinder-shaped diamond having a high aspect ration can be obtained by using the anodized alumina as a mold in the formation of diamond film and growing diamond through the CVD process and thereafter dissolving out the anodized alumina.

BRIEF DESCRIPTION OF THE DRAWINGS

The invention will be described with reference to the accompanying drawings, wherein.

DETAILED DESCRIPTION OF THE INVENTION

Figure 1:
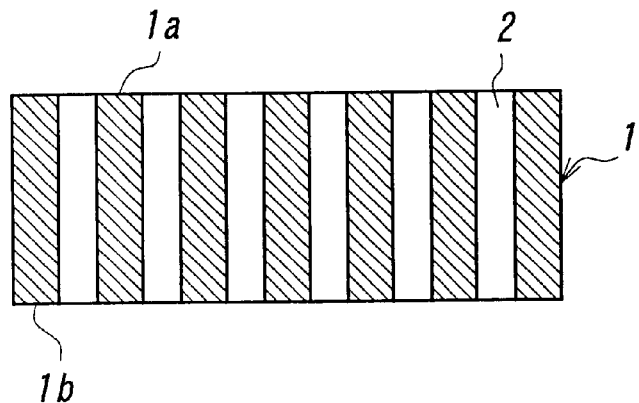
FIG. 1 is a diagrammatically section view of an anodized porous alumina 1 used as a mold in the present invention.

FIGS. 1 to 6 show steps illustrating a preferable embodiment of the present invention. In FIG. 1 is diagrammatically and sectionally an anodized porous alumina 1. The anodized porous alumina 1 has a regular arrangement of pores 2. Numerals 1a and 1b are end faces of the anodized porous alumina 1. The anodized porous alumina 1 having a pore size of 5–400 nm and a pore interval of 100–500 nm is preferable to be used as a mold for vapor phase growth of diamond. Moreover, the anodized porous alumina itself has been described in publicly known literatures.

Figure 2:
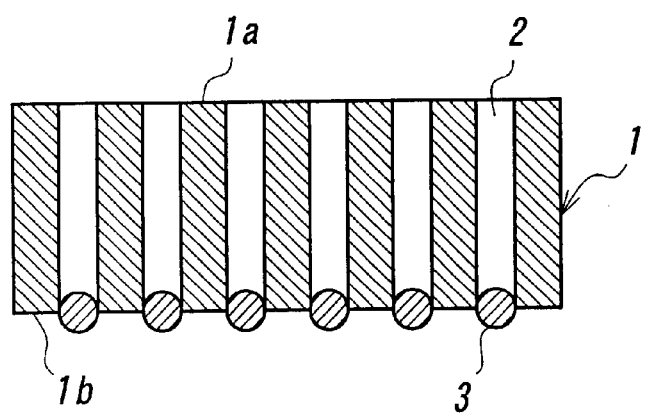
FIG. 2 is a diagrammatically section view illustrating a state of adhering fine particles 3 as a growth nucleus of diamond to a one-side face 1b of an anodized porous alumina 1.

FIG. 2 illustrates a state that diamond particles 3 serving as a growth nucleus for vapor phase growth are carried on a side of the end face 1b of the anodized porous alumina 1. The diamond particle 3 as the growth nucleus is suitable to have a size close to the pore size of the anodized porous alumina 1. That is, the diamond particles 3 as a growth nucleus can be carried by applying onto the end face 1b of the anodized porous alumina 1.

Figure 3:
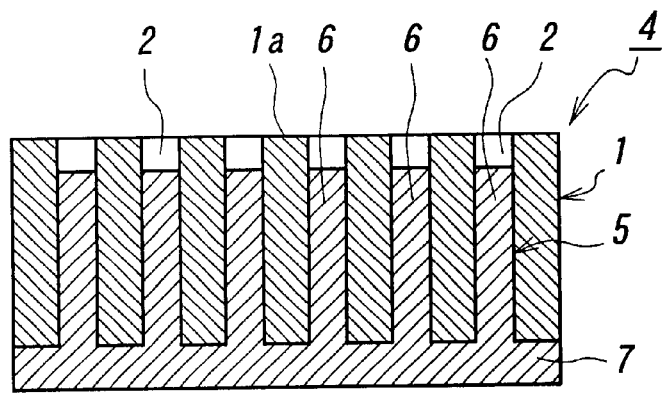
FIG. 3 is a diagrammatically section view of a composite body 4 consisting of an anodized porous alumina 1 and a diamond cylinder structural body 5.

A composite body 4 shown in FIG. 3 is obtained by conducting the vapor phase growth of diamond at a state shown in FIG. 2. In the composite structure 4, the anodized porous alumina 1 and the diamond cylinder structural body 5 are combined with each other.

In the vapor phase growth, the anodized porous alumina 1 carried with the growth nucleuses 3 is placed in a vessel for the vapor phase growth of diamond to conduct the vapor phase growth. As the vapor phase growth of diamond can be used various processes, but a microwave plasma chemical vapor phase growth process can typically be used. As an example of film forming conditions, the followings can be mentioned.

Flow rate of carrier hydrogen: 300–500 sccm (for example, 400 sccm)

Internal pressure: 60–100 Torr (for example, 80 Torr)

Plasma input: 2000–5000 W (for example, 3000 W)

Quantity of hydrogen flowing through acetone: 10–20 sccm (for example, 15 sccm)

An electric conductivity can be provided by adding a doping metal source to a gas material (for example, acetone) to dope the resulting diamond thin film with a particular metal element. As such a metal element, boron can be mentioned. The doping with boron can be carried out by dissolving boric acid in acetone as a carbon source. Diamond preferentially grows using fine diamond particles applied onto the bottom of the anodized alumina as a growth nucleus. As a result, diamond is formed at a state of successively filling the interior of each pore 2 of the anodized porous alumina 1 from the bottom thereof.

Figure 4:
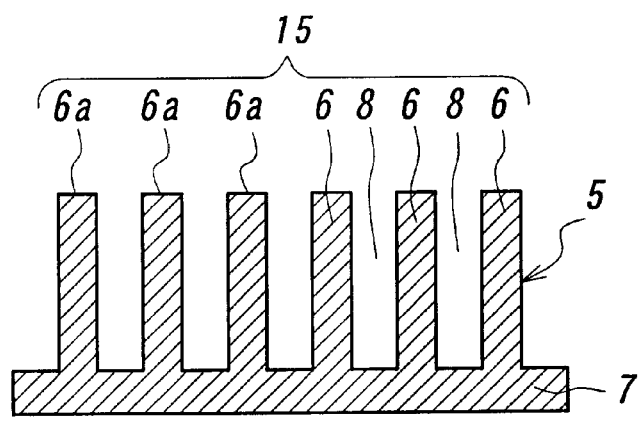
FIG. 4 is a diagrammatically section view of a diamond cylinder structural body 5 obtained by removing an anodized porous alumina 1 from a composite body 4.

After the chemical vapor phase growth, a diamond cylinder structural body 5 shown in FIG. 4 can be obtained by selectively dissolving out the anodized porous alumina 1. The structural body 5 consists of an array 15 of many cylinders 6 and a base 7 connecting the bottoms of the cylinders 6. As a solution for selective dissolution of the anodized porous alumina 1, an aqueous solution of sodium hydroxide can be used. And also, if the anodized porous alumina 1 is crystallized by exposing to a high temperature for a long time in the formation of the diamond film, an etching treatment with a concentrated phosphoric acid heated to a high temperature can effectively be used.

Moreover, a top face 6a of each cylinder 6 may be protruded or heaved to a certain extent because the central portion of the tip face is selectively subjected to an etching. However, it is preferable that a dent is not formed in the top face 6a, and the top face 6a is most preferable to be substantially flat. And also, the structural body 5 is provided with the base made of diamond, but the base 7 is not necessarily required in the performance of the present invention. Alternatively, a major portion of the base 7 may be made of a joining material other than diamond. Numeral 8 is a space between the cylinders.

Figure 5:
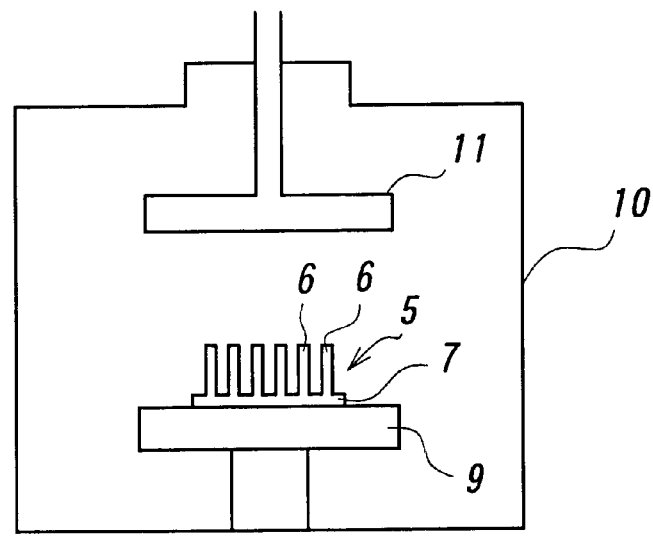
FIG. 5 is a schematic view illustrating a state of subjecting a diamond cylinder structural body 5 to a plasma etching treatment.

Next, as schematically shown in FIG. 5, the diamond cylinder structural body 5 is placed in a plasma etching chamber 10 to conduct plasma etching. In the etching, for example, a pair of parallel flat-plate type high-frequency plasma etching apparatuses 9, 11 can be used, but there is no restriction on the type of the chamber. The etching atmosphere is preferable to contain oxygen, and the partial pressure of oxygen is preferable to be 0.1–0.2 Torr, for example, 0.15 Torr. A mask is not placed.

Figure 6:
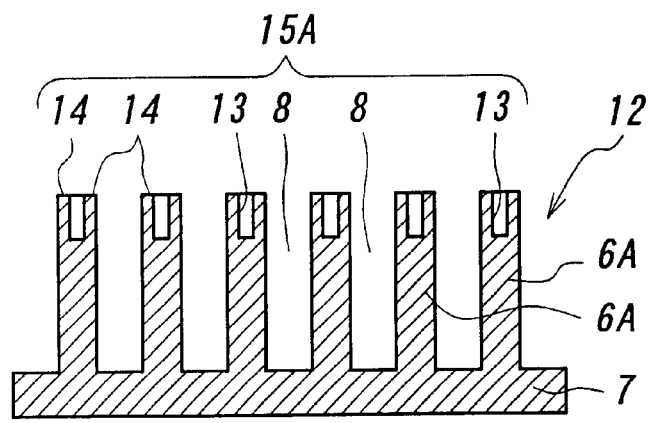
FIG. 6 is a diagrammatically section view of a diamond cylinder structural body 12 having a hollow construction.

As a result, a diamond cylinder structural body 12 as shown in FIG. 6 is obtained. This structural body 12 consists of an array 15A of many cylinders 6A and a base 7 connecting the bottoms of the cylinders 6A. A dent 13 dented from the top face is formed in the top of each cylinder 6A, while a cylindrical protrusion 14 remains so as to surround the dent 13. A ratio of depth to width of the dent 13 is preferably not less than 0.5 and more particularly not less than 1.

EXAMPLE 1

A diamond cylinder structural body 12 is produced according to the procedure shown in FIGS. 1 to 6. Concretely, an aluminum plate is anodized with 0.3M phosphoric acid at 2° C. and a constant voltage of 190 volts for 80 minutes and then an aluminum matrix is selectively dissolved out with mercurous chloride to obtain an anodized porous alumina. Thereafter, a barrier layer located at the bottom of the anodized porous alumina is removed by etching with 10 wt % phosphoric acid to obtain an anodized porous alumina 1 having pores as through-holes. The thus obtained anodized alumina 1 has a pore size of 0.3 $\mu$m, a pore interval of 0.5 $\mu$m, and a film thickness of 8 $\mu$m.

Fine diamond particles 3 having an average particle size of 50 nm are sprinkled on a one-side face 1b of the anodized porous alumina 1 and gently rubbed to adhere the fine diamond particles 3 onto the face 1b of the anodized porous alumina 1. The anodized porous alumina 1 is placed in a vessel for the formation of diamond film so as to cast down the face 1b covered with the fine diamond particles 3 and then the diamond film is formed under the following film forming conditions:

Flow rate of carrier hydrogen: 400 sccm

Internal pressure: 80 Torr

Plasma input: 3000 W

Quantity of hydrogen flowing through acetone: 15 sccm

Film forming time: 3 hours

After the formation of the diamond film, the anodized porous alumina 1 is dissolved out by immersing in a concentrated phosphoric acid at 200° C. for 1 hour to obtain a diamond cylinder structural body 5. Thereafter, etching is performed by using a high-frequency plasma etching apparatus under conditions that oxygen is used as a reaction gas, an oxygen pressure is 0.15 Torr, a high frequency output is 180 W and an etching time is 100 seconds. As a result, a dent 13 is formed in a top portion of each cylinder 6A of the resulting diamond cylinder structural body 12. Each of the cylinders 6A has a diameter of 0.3 μm and a height of 0.5 μm, and the dent 13 has a diameter of 280 nm and a depth of 300 nm.

According to the present invention, the regular array of cylinders having a hollow construction in their top portion can be manufactured rapidly at a large area scale with a low cost.

The cylindrical diamond having a hollow construction in its top portion can realize efficient concentration of electrical field by utilizing a sharp edge portion at a section of the cylinder as compared with a cylindrical diamond having no hollow portion and is made possible to apply to an electron emission source with a high efficiency. And also, it is possible to carry various kinds of substances on the top of each cylinder.

What is claimed is:

1. A method for manufacturing an array of cylinders each made of diamond and having a dent in its top face, which comprises subjecting a cylinder array of diamond to a plasma etching to form a dent in the top face of each cylinder.

2. The method according to claim 1, wherein each of said cylinders is grown in each of pores in an anodized porous alumina used as a mold by forming diamond in each pore of the anodized porous alumina through a vapor phase growth process.

3. The method according to claim 1, wherein said plasma etching is carried out in an atmosphere containing oxygen.

4. The method according to claim 1, wherein said dent has a ratio of depth to width of not less than 1.

5. A method for manufacturing an array of vertically-arranged multiple micro-cylinders, each cylinder made of diamond and having a recess on its top surface, said method comprising the steps of: (a) forming an array of vertically-arranged multiple micro-cylinders made of diamond; and (b) plasma-etching the top surfaces of the micro-cylinders without a mask to form a recess on the top surfaces of the micro-cylinders.

6. The method according to claim 5, wherein step (a) comprises depositing diamond by a CVD method in pores of an anodized porous alumina used as a mold, and removing the anodized porous alumina.

7. The method according to claim 5, wherein step (b) is conducted using oxygen as a reaction gas.

* * * * *